(12) United States Patent
Leong et al.

(10) Patent No.: US 9,230,886 B2
(45) Date of Patent: Jan. 5, 2016

(54) METHOD FOR FORMING THROUGH SILICON VIA WITH WAFER BACKSIDE PROTECTION

(71) Applicant: GLOBALFOUNDRIES Singapore Pte. Ltd., Singapore (SG)

(72) Inventors: Lup San Leong, Singapore (SG); Zheng Zou, Singapore (SG); Alex Kai Hung See, Singapore (SG); Hai Cong, Singapore (SG); Xuesong Rao, Singapore (SG); Yun Ling Tan, Singapore (SG); Huang Liu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/575,639

(22) Filed: Dec. 18, 2014

(65) Prior Publication Data

US 2015/0137359 A1    May 21, 2015

Related U.S. Application Data

(62) Division of application No. 13/542,256, filed on Jul. 5, 2012, now Pat. No. 8,940,637.

(51) Int. Cl.
*H01L 23/48* (2006.01)
*H01L 23/00* (2006.01)
(Continued)

(52) U.S. Cl.
CPC ........ *H01L 23/481* (2013.01); *H01L 21/02107* (2013.01); *H01L 21/486* (2013.01); *H01L 21/76898* (2013.01); *H01L 24/13* (2013.01); *H01L 24/16* (2013.01); *H01L 2224/13009* (2013.01); *H01L 2224/1357* (2013.01)

(58) Field of Classification Search
CPC .. H01L 21/76898; H01L 23/481; H01L 24/16
See application file for complete search history.

(56) References Cited

U.S. PATENT DOCUMENTS 6,734,084 B1  5/2004  Nemoto et al.
7,214,615 B2  5/2007  Miyazawa
(Continued)

FOREIGN PATENT DOCUMENTS

WO    2012020689 A1    2/2012

OTHER PUBLICATIONS

K. Hozawa et al., "Impact of Backside Cu Contamination in the 3D Integration Process," 2009 Symposium on VLSI Technology Digest of Technical Papers, IEEE, 2009, pp. 172-173.
(Continued)

*Primary Examiner* — Joseph C Nicely
(74) *Attorney, Agent, or Firm* — Ditthavong & Steiner, P.C.

(57) ABSTRACT

Semiconductor devices with through silicon vias (TSVs) are formed without copper contamination. Embodiments include exposing a passivation layer surrounding a bottom portion of a TSV in a silicon substrate, forming a silicon composite layer over the exposed passivation layer and over a bottom surface of the silicon substrate, forming a hardmask layer over the silicon composite layer and over the bottom surface of the silicon substrate, removing a section of the silicon composite layer around the bottom portion of the TSV using the hardmask layer as a mask, re-exposing the passivation layer, and removing the hardmask layer and the re-exposed passivation layer to expose a contact for the bottom portion of the TSV.

17 Claims, 10 Drawing Sheets

(51) Int. Cl.
*H01L 21/768* (2006.01)
*H01L 21/02* (2006.01)
*H01L 21/48* (2006.01)

(56) References Cited

U.S. PATENT DOCUMENTS

| | | | |
|---|---|---|---|
| 7,902,643 B2 | 3/2011 | Tuttle | |
| 7,910,473 B2 | 3/2011 | Chen | |
| 2002/0115290 A1* | 8/2002 | Halahan et al. | 438/667 |
| 2003/0219939 A1 | 11/2003 | Ahmed et al. | |
| 2005/0029630 A1 | 2/2005 | Matsuo | |
| 2005/0151228 A1 | 7/2005 | Tanida et al. | |
| 2007/0032061 A1 | 2/2007 | Farnworth et al. | |
| 2009/0243047 A1* | 10/2009 | Wolter et al. | 257/621 |
| 2010/0025852 A1 | 2/2010 | Ueki et al. | |
| 2010/0038800 A1 | 2/2010 | Yoon et al. | |
| 2010/0164117 A1* | 7/2010 | Chen | 257/774 |
| 2010/0178747 A1* | 7/2010 | Ellul et al. | 438/386 |
| 2011/0095435 A1 | 4/2011 | Volant et al. | |
| 2012/0061827 A1* | 3/2012 | Fujita | 257/737 |
| 2012/0074584 A1* | 3/2012 | Lee et al. | 257/774 |
| 2012/0091520 A1* | 4/2012 | Nakamura | 257/303 |
| 2013/0049127 A1* | 2/2013 | Chen et al. | 257/369 |
| 2013/0113103 A1* | 5/2013 | West et al. | 257/751 |
| 2013/0140700 A1* | 6/2013 | Ohmi | 257/751 |
| 2013/0334699 A1* | 12/2013 | Kuo et al. | 257/774 |

OTHER PUBLICATIONS

K. Lee et al., "Concerns of 3D Integration Technology Using TSV," Conference Publication, 6th Annual SEMATECH Symposium Japan, Sep. 13-15, 2010, 21 pages.

* cited by examiner

METHOD FOR FORMING THROUGH SILICON VIA WITH WAFER BACKSIDE PROTECTION

CROSS REFERENCE TO RELATED APPLICATION

This Application is a Divisional of U.S. application Ser. No. 13/542,256, filed Jul. 5, 2012, the content of which is incorporated herein by reference in its entirety.

TECHNICAL FIELD

The present disclosure relates to a method of fabricating semiconductor devices with through silicon vias (TSVs). The present disclosure is particularly applicable to fabricating semiconductor devices with TSVs with wafer backside protection from copper contamination.

BACKGROUND

The integration of hundreds of millions of circuit elements, such as transistors, on a single integrated circuit necessitates further scaling down or micro-miniaturization of the physical dimensions of the circuit elements, including interconnection structures. Micro-miniaturization has engendered a dramatic increase in transistor engineering complexity, resulting in several problems.

One such problem is copper contamination at the backside surface of silicon wafers during TSV exposure by backgrind and reactive ion etch (RIE). The TSV exposure and RIE can cause copper ion migration into active device regions. This issue is especially problematic after wafer thinning.

A need therefore exists for methodology enabling formation of devices including TSVs with wafer backside protection from copper contamination, and the resulting device.

SUMMARY

An aspect of the present disclosure is an efficient method of fabricating a semiconductor device with wafer backside protection from copper contamination.

Another aspect of the present disclosure is a semiconductor device including a wafer backside protection layer surrounding an exposed TSV.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: exposing a passivation layer surrounding a bottom portion of a TSV in a silicon substrate, forming a silicon composite layer over the exposed passivation layer and over a bottom surface of the silicon substrate, forming a hardmask layer over the silicon composite layer and over the bottom surface of the silicon substrate, removing a section of the silicon composite layer around the bottom portion of the TSV using the hardmask layer as a mask, re-exposing the passivation layer, and removing the hardmask layer and the re-exposed passivation layer to expose a contact for the bottom portion of the TSV.

Aspects of the present disclosure include forming the hardmask layer of a spin-on resist or planarization film. An additional aspect includes removing the section of the silicon composite layer by wet etching, dry etching, or a combination thereof. Another aspect includes removing the hardmask layer and the passivation layer by wet etching, dry etching, or a combination thereof. Further aspects include forming an oxide layer over the bottom portion of the TSV and the bottom surface of the silicon substrate prior to forming the silicon composite layer, and removing the oxide layer over the bottom portion of the TSV concurrently with the hardmask layer and the passivation layer to expose a contact for the bottom portion of the TSV. Yet another aspect includes forming a mask with the hardmask layer by forming the hardmask layer over the entire silicon composite layer and planarizing down to the silicon composite layer over the bottom portion of the TSV to expose the section of the silicon composite layer. An additional aspect includes planarizing the hardmask layer by chemical mechanical polishing, wet etching, or a combination thereof, exposing the section of the silicon composite layer. Other aspects including removing a protective film under the passivation layer from a bottom surface of the TSV after removing the hardmask layer and the passivation layer to expose the contact for the bottom portion of the TSV. A further aspect includes forming the hardmask layer to a thickness of 1 µm to 3 µm.

Another aspect of the present disclosure includes backgrinding a bottom surface of a silicon substrate exposing a bottom portion of a TSV surrounded by a passivation layer and a protective layer, forming an oxide layer over the bottom portion of the TSV, forming a silicon composite layer over the bottom portion of the TSV and the bottom surface of the silicon substrate, forming a hardmask layer over the silicon composite layer, planarizing the hardmask layer down to the silicon composite layer over a bottom surface of the TSV, and removing a section of the silicon composite layer around the bottom portion of the TSV.

An additional aspect includes removing the passivation layer and the protective layer to expose a contact for the bottom surface of the TSV. Yet another aspect includes planarizing the hardmask layer by chemical mechanical polishing, wet etching, or a combination thereof to expose the section of the silicon composite layer.

Another aspect of the present disclosure is a device including: a silicon substrate, an exposed portion of a through silicon via (TSV) protruding out from a bottom surface of the silicon substrate, and a silicon composite layer covering the remaining bottom surface of the silicon substrate.

Aspects include a device including an oxide layer between the silicon substrate and the silicon composite layer. An additional aspect includes the oxide layer being formed to a thickness of 100 Å to 500 Å. A further aspect includes the silicon composite layer being formed of silicon nitride, silicon carbide, or a combination thereof. Another aspect includes the exposed portion of the TSV protruding 0.5 µm to 3 µm out from the bottom surface of the silicon substrate. An additional aspect includes the device including a protective film and a passivation layer between the TSV and the silicon substrate. A further aspect includes the passivation layer ending at the bottom surface of the silicon composite layer. Yet another aspect includes the protective layer extending down sides of the exposed portion of the TSV.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 1 through 9 schematically illustrate wafer backside protection steps and a resulting substrate including a TSV and a backside contamination protection layer, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of semiconductor device failure because of copper contamination during backgrinding owing to no gettering layer at the back surface of thinned wafer semiconductors and from copper TSVs owing to poor step coverage of the barrier layer. In accordance with embodiments of the present disclosure, a backside wafer contamination protection layer is produced prior to exposing the bottom of the TSV.

Methodology in accordance with embodiments of the present disclosure includes exposing a passivation layer surrounding a bottom portion of a TSV in a silicon substrate. A silicon composite layer is then formed over the exposed passivation layer and over a bottom surface of the silicon substrate. Next, a hardmask layer of a spin-on resist or planarization film is formed over the silicon composite layer and over the bottom surface of the silicon substrate. A mask made using the hardmask layer may be formed by forming the hardmask layer over the entire silicon composite layer and planarizing down to the silicon composite layer over a bottom portion of the TSV to expose a section of the silicon composite layer. The section of the silicon composite layer around the bottom portion of the TSV is removed by wet etching, dry etching, or a combination thereof using the mask of the hardmask layer, re-exposing the passivation layer. Then, the hardmask layer and the re-exposed passivation layer are removed exposing a contact for the bottom portion of the TSV.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
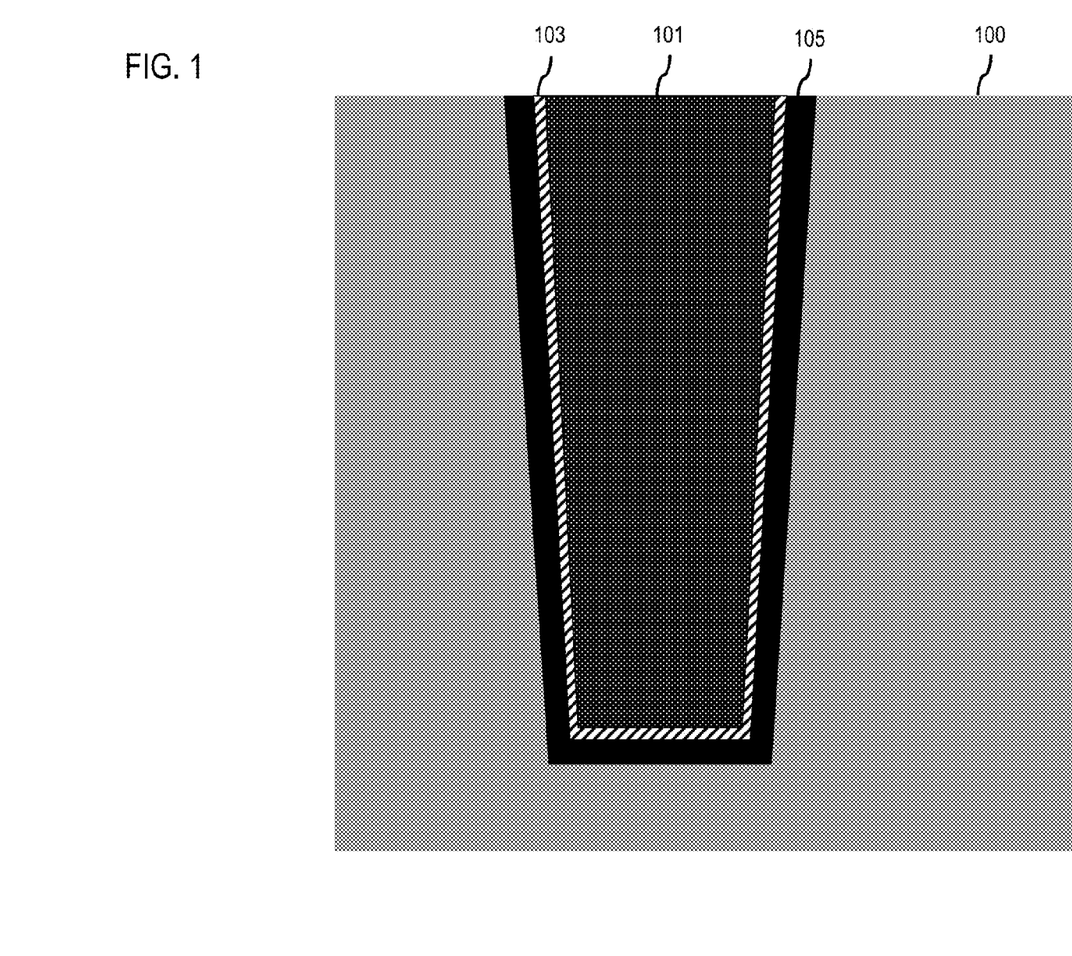

Adverting to FIG. 1, a method of forming a semiconductor device with wafer backside protection from copper contamination, in accordance with an exemplary embodiment, begins with a silicon substrate 100 including a TSV 101 surrounded by a protective film 103 and a passivation layer 105. As illustrated, the protective film 103 is contiguous with the TSV 101 and the passivation layer 105, and the passivation layer is contiguous with the silicon substrate 100. The TSV 101 may be made of any conductive metal, such as copper (Cu). The protective film 103 may be formed of tantalum (Ta) or tantalum nitride (TaN). The passivation layer 105 may be formed of tetraethyl orthosilicate (TEOS) or any other passivation material.

Figure 2:
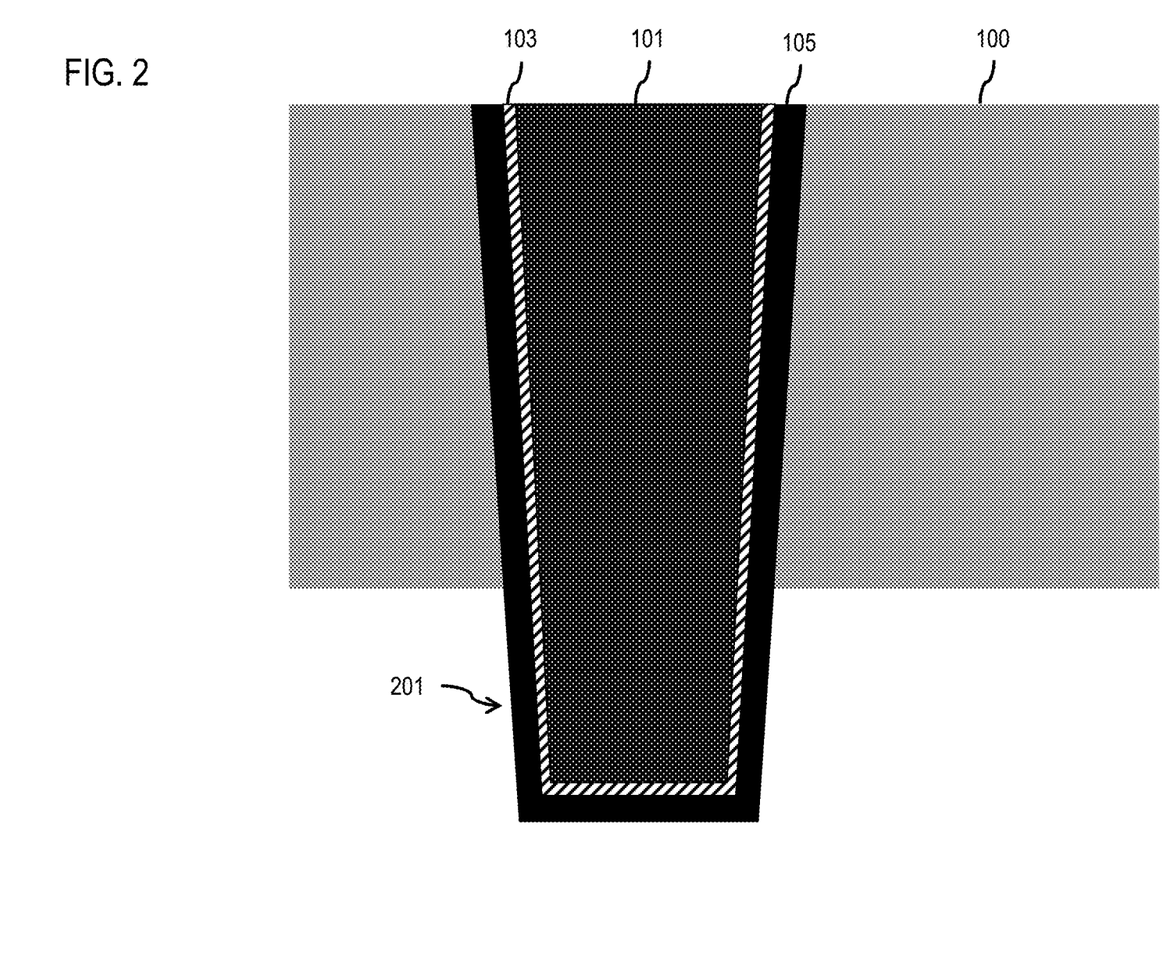

Next, as illustrated in FIG. 2, the method proceeds with backgrinding of the silicon substrate 100 down to approximately the passivation layer 105, followed by etching of the silicon substrate 100 to expose a bottom portion 201 of the TSV 101. The etching of the silicon substrate 100 may be accomplished using ammonium hydroxide ($NH_4OH$), potassium hydroxide (KOH), or a combination thereof. After etching the silicon substrate 100, the bottom portion 201 of the TSV 101 may protrude 0.5 to 3 µm (e.g., 1 µm) from the bottom surface of the silicon substrate 100.

Figure 3:
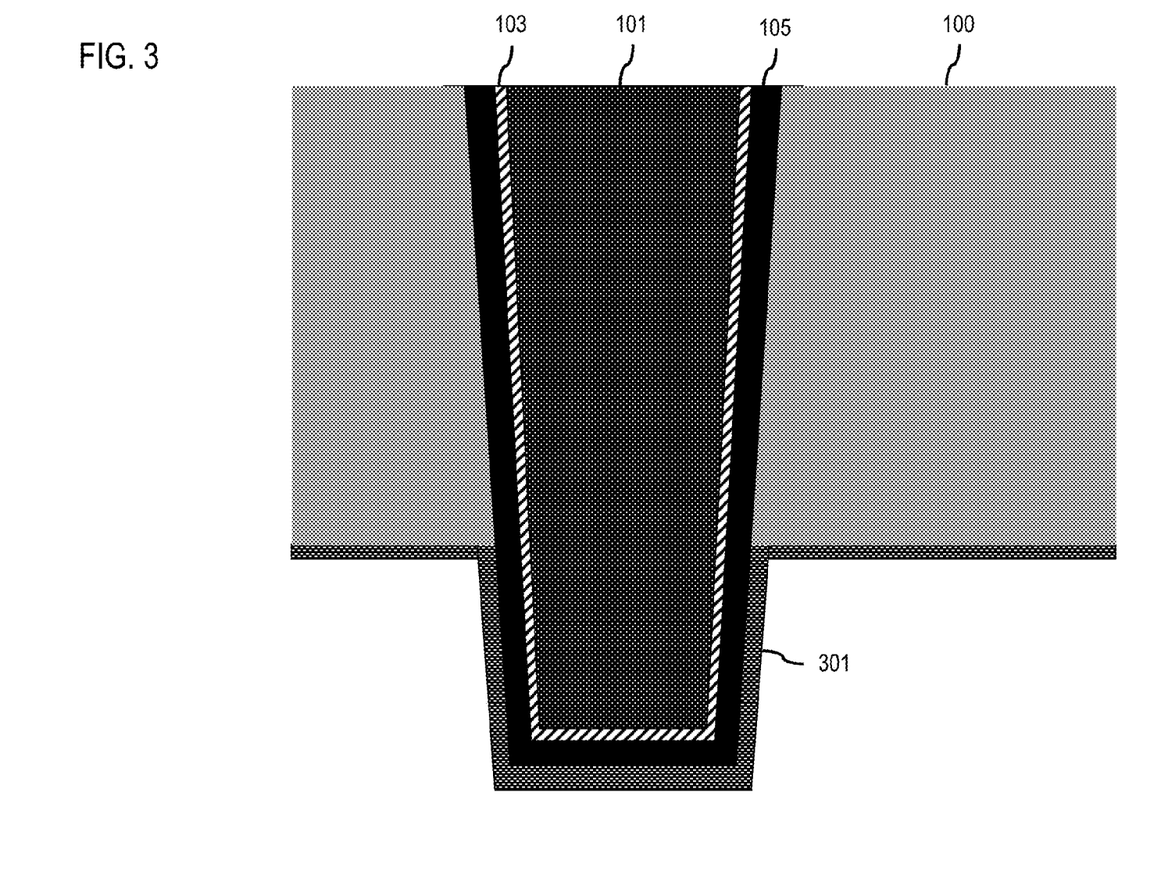

Next, an oxide layer 301 is formed over the bottom portion 201 of the TSV 101 and the bottom surface of the silicon substrate 100, as illustrated in FIG. 3. The oxide layer 301 may be formed of TEOS, a high aspect ratio oxide (HARP), amorphous hydrogenated carbon doped silicon oxide (SiCOH) and other doped silicon oxides. The oxide layer 301 may be formed to a thickness of 100 to 500 Å (e.g., 300 Å).

Figure 4:
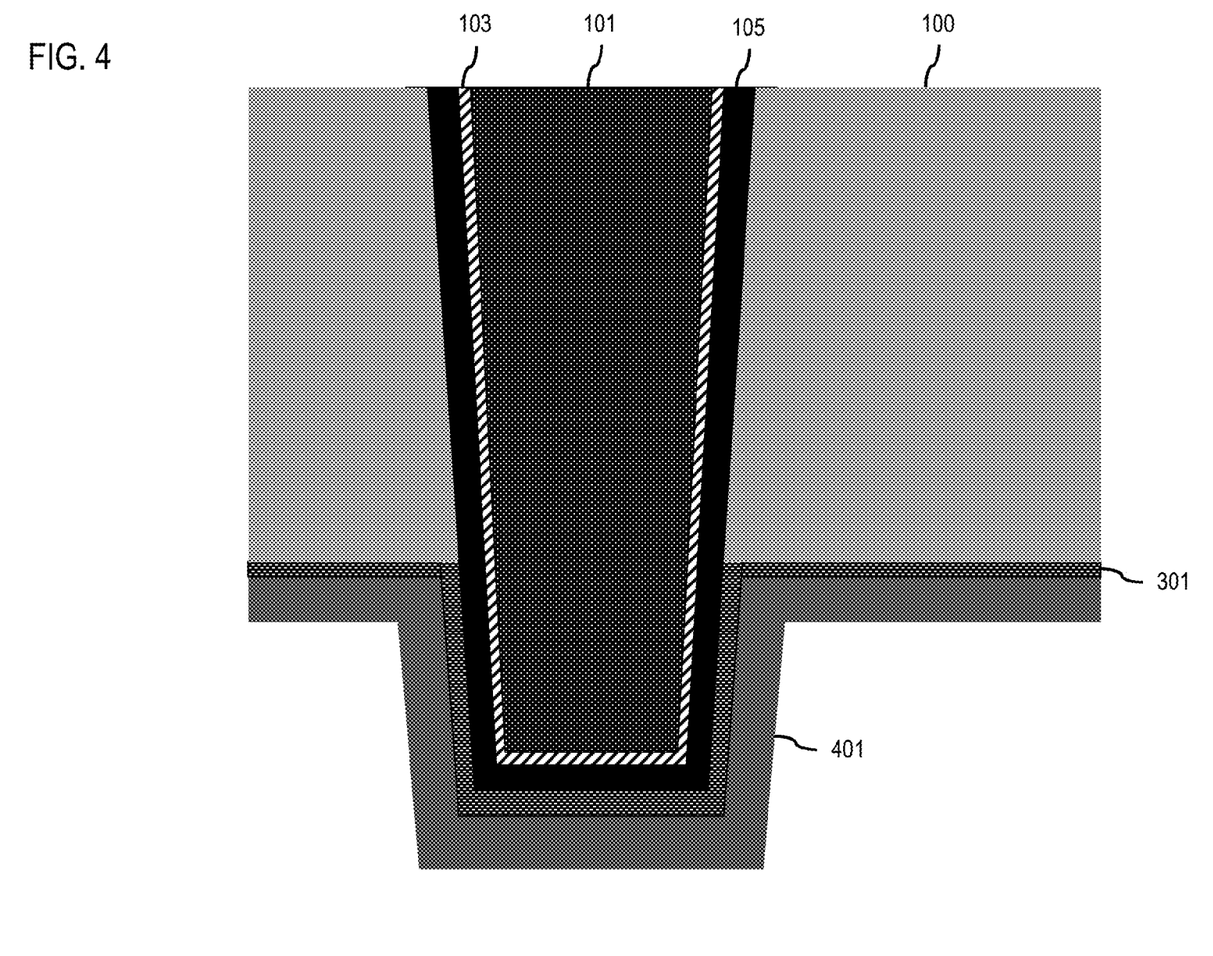

Adverting to FIG. 4, a silicon composite layer 401 is formed over the oxide layer 301. The silicon composite layer 401 may be formed of silicon nitride (SiN), silicon carbide (SiC), or a combination thereof at a thickness of 500 to 1000 Å (e.g., 750 Å). The silicon composite layer 401 may act as a backside contamination protection layer during the exposure of the TSV.

Figure 5A:
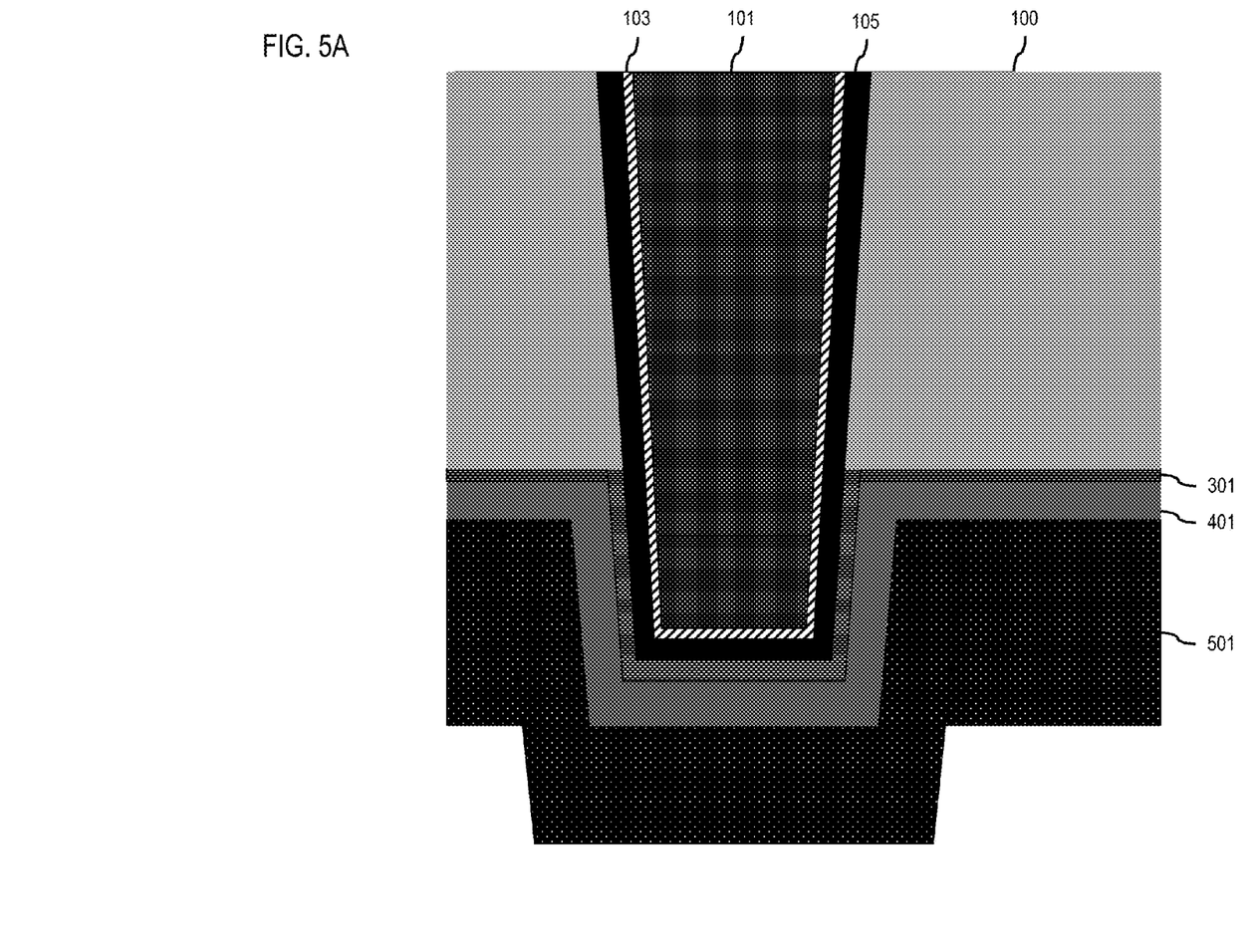
Figure 5B:
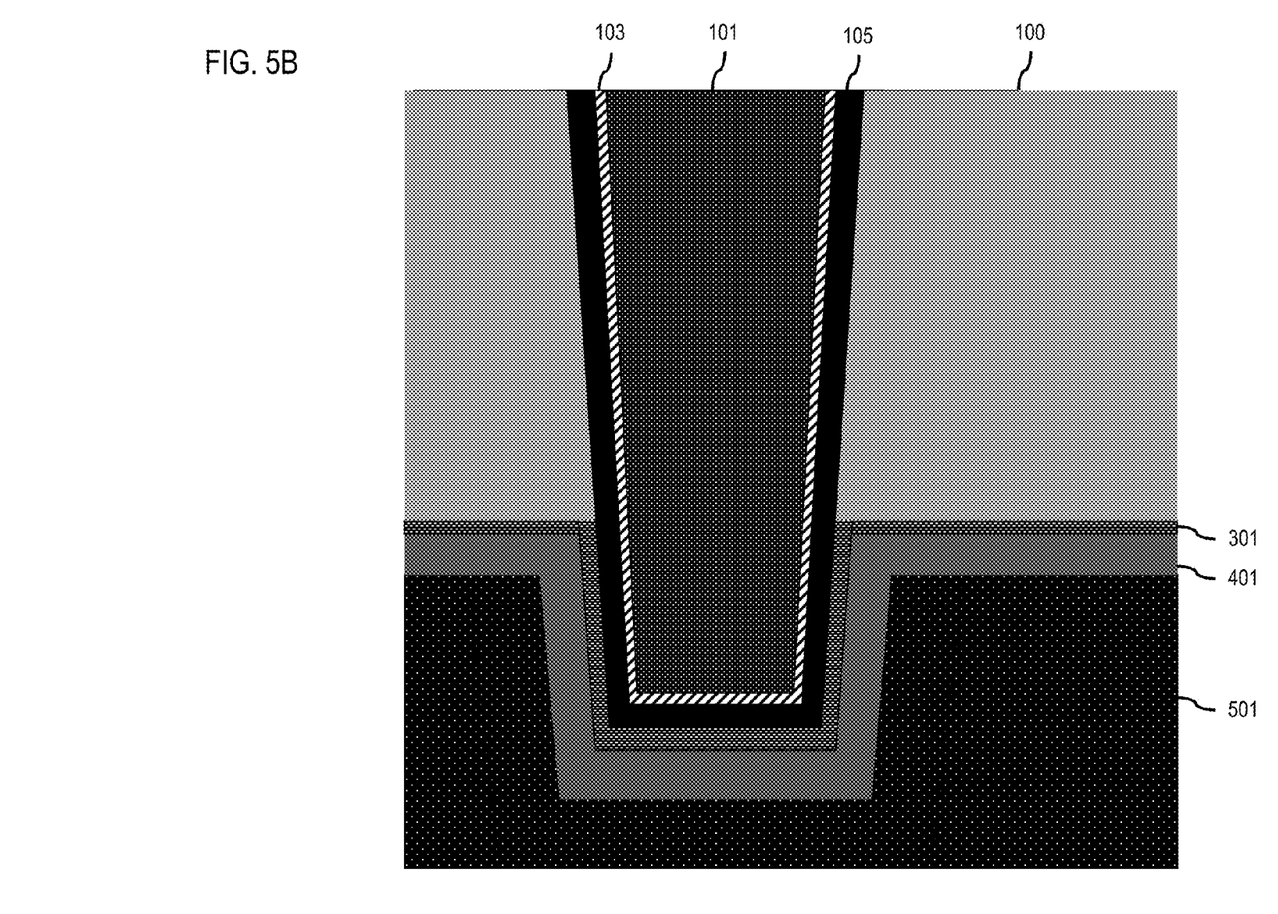

FIGS. 5A and 5B illustrate various embodiments for forming a hardmask layer 501 over the silicon composite layer 401. In both embodiments, the hardmask layer 501 may be formed to a thickness of 1 to 3 µm (e.g., 1 µm) and may be formed of TEOS.

Figure 6:
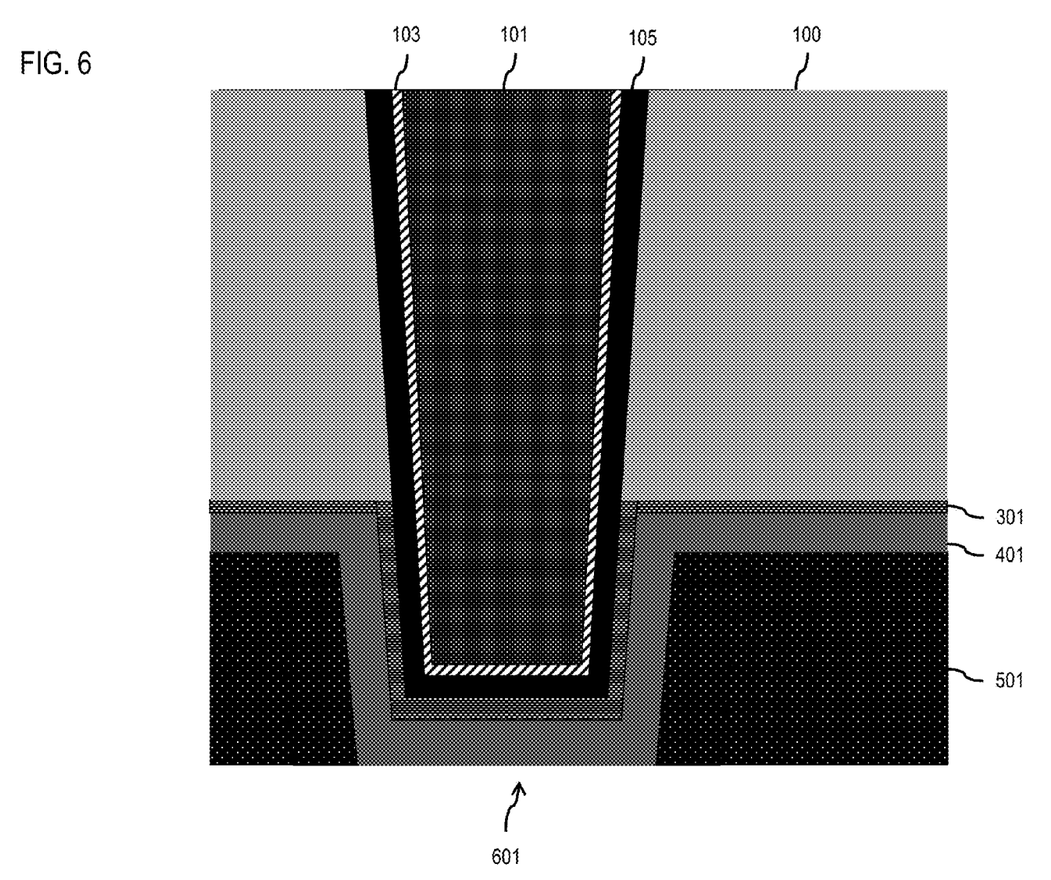

As illustrated in FIG. 5A, the hardmask layer 501 may be deposited over the silicon composite layer 401. The hardmask layer 501 may be deposited according to any known deposition method, such as chemical vapor deposition. Subsequently, as illustrated in FIG. 6, a mask is created using the hardmask layer 501 by removing the hardmask layer 501 down to the silicon composite layer 401 over the bottom portion of the TSV 101, to expose a section 601 of the silicon composite layer 401. The hardmask layer 501 may then be planarized using a fixed abrasive, low selectivity chemical mechanical polish (CMP) slurry, such as CMP platen 2 to expose the section 601 of the silicon composite layer 401.

Adverting back to FIG. 5B, the hardmask layer 501 may instead be formed of a spin-on resist or a planarization film followed by a hard bake at 100 to 550° C. Subsequently, the mask of FIG. 6 may be created by removing the hardmask layer 501 down to the silicon composite layer 401 over the bottom portion 201 of the TSV 101 to expose the section 601 of the silicon composite layer 401 using a wet etch that removes TEOS. Alternatively, a combination of planarization and wet etching may be used.

Figure 7:
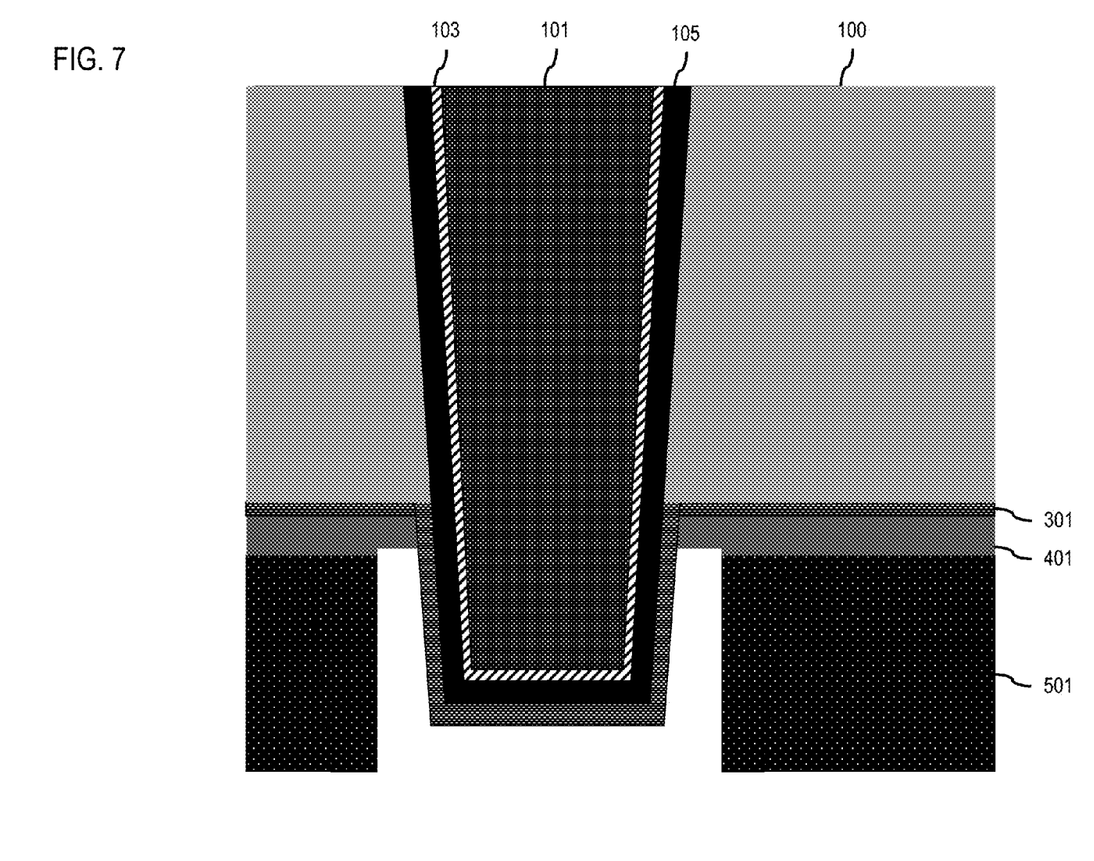

Adverting to FIG. 7, the section 601 of the silicon composite layer 401 may be removed by wet etching, dry etching, or a combination thereof. For instance, the section 601 of the silicon composite layer 401 may be removed by a wet etch using phosphoric acid ($H_3PO_4$).

Figure 8:
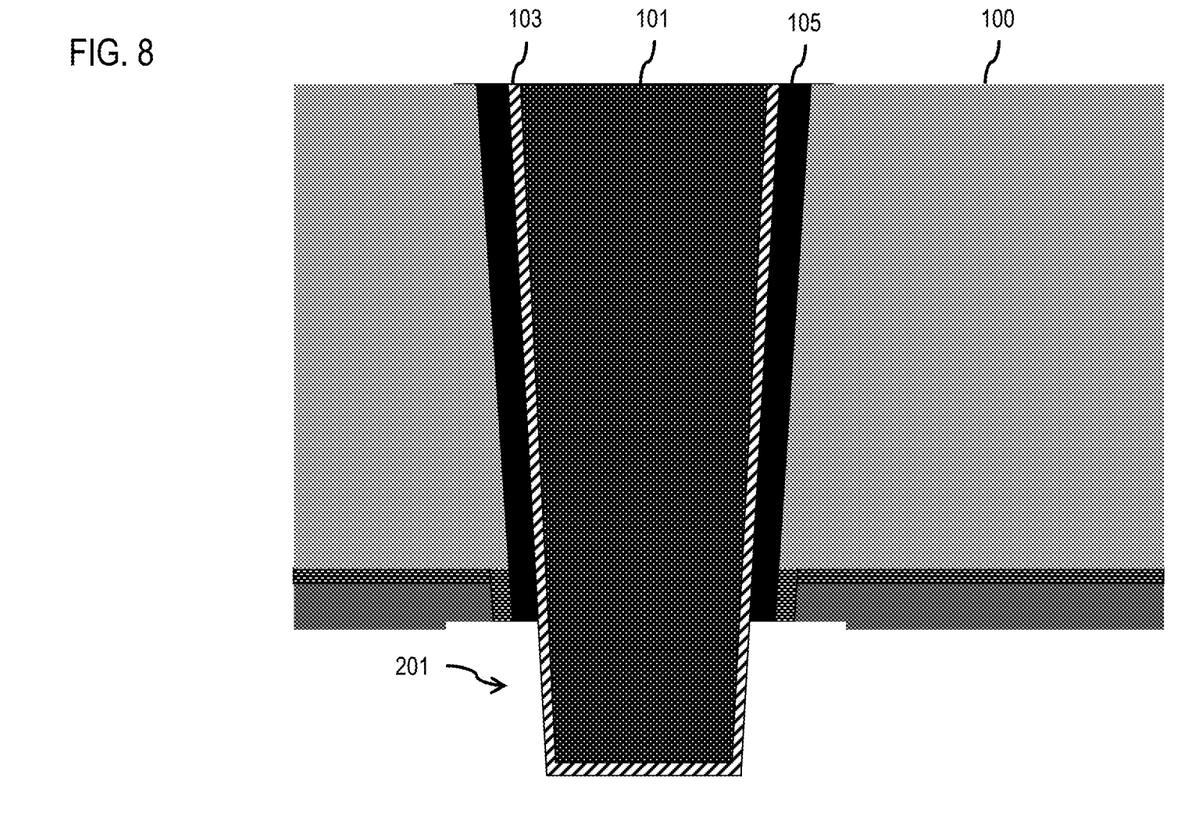

As illustrated in FIG. 8, the remaining hardmask layer 501, the exposed portion of the oxide layer 301, and a portion the passivation layer 105 may be removed by wet etching, dry etching, or a combination thereof to re-expose the bottom portion 201 of the TSV 101. However, unlike the first exposure illustrated in FIG. 2, the bottom portion 201 is exposed in FIG. 8 without the passivation layer 105. For instance, the remaining hardmask layer 501, the exposed portion of the oxide layer 301, and a portion the passivation layer 105 may be removed by a wet etch with dilute hydrofluoric acid (HF).

Figure 9:
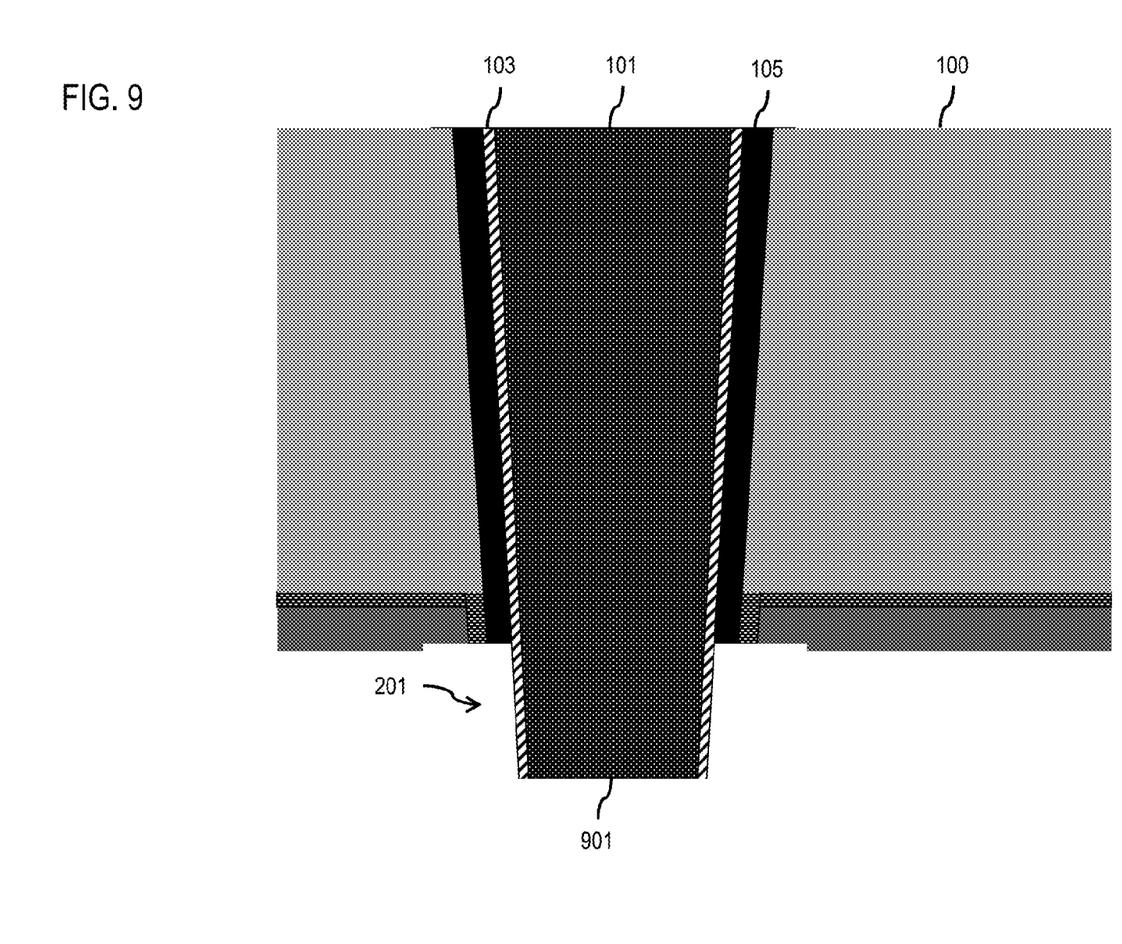

As shown in FIG. 8, the re-exposed bottom portion 201 of the TSV 101 may still include the protective film 103. Adverting to FIG. 9, the protective film 103 may be removed from the bottom surface of the re-exposed bottom portion 201 by CMP or other methods (e.g., RIE), to expose a contact 901 for the bottom portion 201 of the TSV 101.

The embodiments of the present disclosure achieve several technical effects, including preventing copper contamination at the backside of wafers during TSV exposure. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
  a silicon substrate;
  a silicon composite layer covering a bottom surface of the silicon substrate, the silicon composite layer having a bottom surface;
  an exposed portion of a through silicon via (TSV) protruding out from the bottom surface of the silicon substrate and the bottom surface of the silicon composite layer;
  a protective film and a passivation layer surrounding the TSV, between the TSV and the silicon substrate,
  wherein the protective film is contiguous with the TSV, and only the protective film extends down sides of the exposed portion of the TSV below the bottom surface of the silicon composite layer.

2. The device according to claim 1, further comprising an oxide layer between the silicon substrate and the silicon composite layer.

3. The device according to claim 2, wherein the oxide layer is formed to a thickness of 100 angstroms (Å) to 500 Å.

4. The device according to claim 1, wherein the silicon composite layer comprises silicon nitride, silicon carbide, or a combination thereof.

5. The device according to claim 1, wherein the silicon composite layer is formed to a thickness of 500 Å to 1000 Å.

6. The device according to claim 1, wherein the exposed portion of the TSV protrudes 0.5 microns (μm) to 3 μm out from the bottom surface of the silicon substrate.

7. The device according to claim 1, wherein the passivation layer is contiguous with the silicon substrate and extends to the bottom surface of the silicon composite layer.

8. A device comprising:
  a silicon substrate;
  a silicon composite layer covering a bottom surface of the silicon substrate, the silicon composite layer having a bottom surface;
  an oxide layer between the silicon composite layer and both the silicon substrate and the TSV;
  an exposed portion of a through silicon via (TSV) protruding out from the bottom surface of the silicon substrate, the oxide layer and the bottom surface of the silicon composite layer; and
  a protective film and a passivation layer surrounding the TSV, between the TSV and the silicon substrate,
  wherein the protective film is contiguous with the TSV, and only the protective film extends down sides of the exposed portion of the TSV below the bottom surface of the silicon composite layer.

9. The device according to claim 8, wherein the oxide layer is formed to a thickness of 100 angstroms (Å) to 500 Å.

10. The device according to claim 8, wherein the silicon composite layer comprises silicon nitride, silicon carbide, or a combination thereof.

11. The device according to claim 8, wherein the silicon composite layer is formed to a thickness of 500 Å to 1000 Å.

12. The device according to claim 8, wherein the protective film comprises tantalum (Ta) or tantalum nitride (TaN).

13. The device according to claim 8, wherein the passivation layer is contiguous with the silicon substrate and extends to a bottom surface of the silicon composite layer.

14. The device according to claim 8, wherein the exposed portion of the TSV protrudes 0.5 microns (μm) to 3 μm out from the bottom surface of the silicon substrate.

15. A device comprising:
  a silicon substrate;
  a silicon composite layer covering a bottom surface of the silicon substrate, the silicon composite layer having a bottom surface;
  an oxide layer between the silicon composite layer and both the silicon substrate and the TSV;
  an exposed portion of a conductive through silicon via (TSV) protruding 0.5 microns (μm) to 3 μm out from the bottom surface of the silicon substrate, the oxide layer and the bottom surface of the silicon composite layer;
  a protective film contiguous with the TSV, surrounding the TSV between the TSV and the silicon substrate; and
  a passivation layer contiguous with the silicon substrate, surrounding the TSV between the TSV and the silicon substrate, and extending to a bottom surface of the silicon composite layer,
  wherein only the protective film extends down sides of the exposed portion of the TSV below the bottom surface of the silicon composite layer.

16. The device according to claim 15, wherein the oxide layer is formed to a thickness of 100 angstroms (Å) to 500 Å.

17. The device according to claim 15, wherein the silicon composite layer is formed to a thickness of 500 Å to 1000 Å.

* * * * *